US011952659B2

(12) United States Patent
Huang et al.

(10) Patent No.: US 11,952,659 B2
(45) Date of Patent: Apr. 9, 2024

(54) METHODS FOR COATING A SUBSTRATE WITH MAGNESIUM FLUORIDE VIA ATOMIC LAYER DEPOSITION

(71) Applicant: CORNING INCORPORATED, Corning, NY (US)

(72) Inventors: Ming-Huang Huang, Ithaca, NY (US); Hoon Kim, Horseheads, NY (US); Jue Wang, Pittsford, NY (US)

(73) Assignee: Corning Incorporated, Corning, NY (US)

( * ) Notice: Subject to any disclaimer, the term of this patent is extended or adjusted under 35 U.S.C. 154(b) by 916 days.

(21) Appl. No.: 16/940,836

(22) Filed: Jul. 28, 2020

(65) Prior Publication Data
US 2021/0032744 A1    Feb. 4, 2021

Related U.S. Application Data

(60) Provisional application No. 62/880,250, filed on Jul. 30, 2019.

(51) Int. Cl.
*G02B 1/115* (2015.01)
*C23C 16/30* (2006.01)
(Continued)

(52) U.S. Cl.
CPC ........ *C23C 16/30* (2013.01); *C23C 16/45553* (2013.01); *G02B 1/115* (2013.01); *H01L 21/67288* (2013.01); *G01N 21/9501* (2013.01)

(58) Field of Classification Search
CPC .............. C23C 16/30; C23C 16/45553; C23C 16/4401; C23C 16/45525;
(Continued)

(56) References Cited

U.S. PATENT DOCUMENTS 6,472,087 B1    10/2002 Otani et al.
9,310,525 B2 *   4/2016 Shibuya ................... G02B 1/11
(Continued)

FOREIGN PATENT DOCUMENTS

EP         1195623 A1    4/2002
WO    2017/025957 A1    2/2017

OTHER PUBLICATIONS

Hennessey et al., "Atomic layer deposition of magnesium fluoride via bis(ethylcyclopentadienyl)magnesium and anhydrous hydrogen fluoride" Journal of Vacuum Science & Technology A, vol. 33, No. 1, Nov. 14, 2014, XP055736269.
(Continued)

*Primary Examiner* — Arnel C Lavarias
(74) *Attorney, Agent, or Firm* — Amy T. Lang

(57) ABSTRACT

Atomic layer deposition methods for coating an optical substrate with magnesium fluoride. The methods include two primary processes. The first process includes the formation of a magnesium oxide layer over a surface of a substrate. The second process includes converting the magnesium oxide layer to a magnesium fluoride layer. These two primary processes may be repeated a plurality of times to create multiple magnesium fluoride layers that make up a magnesium fluoride film. The magnesium fluoride film may serve as an antireflective coating layer for an optical substrate, such as an optical lens.

19 Claims, 10 Drawing Sheets

(51) Int. Cl.
  *C23C 16/455* (2006.01)
  *H01L 21/67* (2006.01)
  *G01N 21/95* (2006.01)

(58) Field of Classification Search
  CPC ........ C23C 16/45527; C23C 16/45555; C23C 16/46; C23C 16/52; G02B 1/115; G02B 1/00; G02B 1/10; G02B 1/11; G02B 1/113; G02B 1/12; G02B 5/28; G02B 5/283; G02B 5/285; G02B 5/286; G01N 21/9501; H01L 21/67288
  USPC ....... 359/614, 601, 609, 577, 580, 581, 582, 359/586, 589; 427/585, 587, 591, 592, 427/593, 162, 164, 165, 166, 248.1, 427/255.1, 255.15, 255.7
  See application file for complete search history.

(56) References Cited

U.S. PATENT DOCUMENTS

| | | |
|---|---|---|
| 9,933,711 B2 | 4/2018 | Shklover et al. |
| 2002/0035024 A1 | 3/2002 | Kato |
| 2009/0141358 A1 | 6/2009 | Cangemi et al. |
| 2012/0308739 A1 | 12/2012 | Lansalot-Matras et al. |
| 2014/0106070 A1 | 4/2014 | Hämäläinen et al. |
| 2018/0327899 A1* | 11/2018 | Wu ................. C23C 16/4404 |
| 2019/0346590 A1 | 11/2019 | Huang et al. |

OTHER PUBLICATIONS

International Search Report and Written Opinion of the International Searching Authority; PCT/US2020/042050; dated Oct. 27, 2020; 9 Pages; European Patent Office.

Pilvi et al., "Study of a novel ALD process for depositing MgF2 thin films", J. Mater. Chem., 2007, 17, pp. 5077-5083.

Putkonen et al., "Atomic Layer Deposition of Metal Fluorides through Oxide Chemistry", J. Mater. Chem., 2011, vol. 21, pp. 14461-14465.

* cited by examiner

METHODS FOR COATING A SUBSTRATE WITH MAGNESIUM FLUORIDE VIA ATOMIC LAYER DEPOSITION

BACKGROUND

This Application claims priority under 35 USC § 119(e) from U.S. Provisional Patent Application Ser. No. 62/880,250, filed on Jul. 30, 2019, and which is incorporated by reference herein in its entirety.

FIELD

The present disclosure relates to atomic layer deposition of an anti-reflective coating including magnesium fluoride. In particular, the present disclosure relates to atomic layer deposition methods for coating an optical substrate (e.g., an optical lens) with one or more magnesium fluoride films.

BACKGROUND

Anti-reflective (AR) coatings are useful in preventing undesirable reflection of light from a surface of an object. In general, light is more likely to reflect from a surface of an object when the light hits the surface at a high incident angle. An object having a surface with a steep surface curvature is more likely to reflect light directed at it because at least some of the light will hit the surface at a relatively high incident angle.

Current physical vapor deposition (PVD) processes for AR coatings suffer from the inability to uniformly coat steep surface curvatures because these processes rely on a generally linear deposition of particles from a deposition source to a deposition target. To address this uniformity issue, complicated motion and screening needs to be incorporated into the process. This increases the complexity of the process, the cost of the process, and the time needed to complete the process.

Accordingly, a need exists for new methods of depositing anti-reflective coatings.

BRIEF SUMMARY

The present disclosure is directed to methods for atomic layer deposition of a magnesium fluoride film. The magnesium fluoride film may serve as an antireflective coating layer for an optical substrate, such as an optical lens. The methods include two primary process steps. The first process step includes the formation of a magnesium oxide layer over a surface of a substrate. This first process step is performed by exposing the substrate to a precursor gas comprising magnesium to form a precursor layer and subsequently exposing the precursor layer to an oxygen-containing gas, resulting in the formation of a magnesium oxide layer. The second process step includes converting the magnesium oxide layer to a magnesium fluoride layer. This second process step is performed by exposing the magnesium oxide layer to a source gas comprising fluorine to form an intermediate layer and subsequently exposing the intermediate layer to an oxygen-containing gas, resulting in the formation of a magnesium fluoride layer. These two primary process steps may be repeated, sequentially, a plurality of times to create multiple magnesium fluoride layers that make up a magnesium fluoride film. By controlling at least the temperature and the type of oxygen-containing gas(es) used, the elemental composition of the magnesium fluoride film can be tailored to produce a film with desired optical properties.

A first aspect (1) of the present application is directed to an atomic layer deposition method for coating an optical lens with a magnesium fluoride layer, the method including (i) exposing an optical lens to a precursor gas including magnesium, thereby forming a magnesium-containing precursor layer over a surface of the lens; (ii) exposing the magnesium-containing precursor layer to a first oxygen-containing gas, thereby forming a magnesium oxide layer; (iii) exposing the magnesium oxide layer to a source gas including fluorine, thereby forming an intermediate layer including magnesium and fluoride; and (iv) exposing the intermediate layer to a second oxygen-containing gas, thereby forming a magnesium fluoride layer.

In a second aspect (2), the atomic layer deposition method according to the first aspect (1) is provided and exposing the magnesium-containing precursor layer to the first oxygen-containing gas is performed at a temperature in a range of 100 degrees C. to 300 degrees C.

In a third aspect (3), the atomic layer deposition method according to the first aspect (1) is provided and exposing the magnesium-containing precursor layer to the first oxygen-containing gas is performed at a temperature in a range of 240 degrees C. to 260 degrees C.

In a fourth aspect (4), the atomic layer deposition method according to any of aspects (1)-(3) is provided and the first oxygen-containing gas includes a gas selected from the group of: water, ozone, hydrogen peroxide, menthol, ethanol, plasma with oxygen, and plasma with oxygen-containing chemicals.

In a fifth aspect (5), the atomic layer deposition method according to any of aspects (1)-(3) is provided and the first oxygen-containing gas includes $H_2O$.

In a sixth aspect (6), the atomic layer deposition method according to any of aspects (1)-(5) is provided and the first oxygen-containing gas includes $H_2O$ and the magnesium-containing precursor layer is exposed to $H_2O$ at a temperature in a range of 240 degrees C. to 260 degrees C.

In a seventh aspect (7), the atomic layer deposition method according to any of aspects (1)-(6) is provided and the source gas including fluorine is an organic source gas.

In an eighth aspect (8), the atomic layer deposition method according to aspect (7) is provided and the organic source gas is selected from the group of: hexafluoroacetylacetone, carbonyl fluoride, chlorine fluoride, chlorine trifluoride, 1-chloro-2,2-difluoroethene, chlorodifluoromethane, 1-chloro-1-fluoroethane, chloropentafluorobenzene, chloropentafluoroethane, chlorotrifluoroethene, chlorotrifluoromethane, dichlorodifluoromethane, 1,2-dichloro-1,1,2,2-tetrafluoroethane, difluoroethane, difluoromethane, fluoropropane, nitrogen trifluoride, pentafluorobenzene, pentafluoroethane, pentafluorophenol, pentafluorotoluene, perfluorocyclobutane, perfluorocyclohexane, perfluorocyclohexene, perfluoroheptane, perfluoromethylcyclohexane, perfluorotoluene, 1,1,1,2-tetrachloro-2,2-difluoroethane, trichlorofluoromethane, trifluoroacetic acid, trifluoroethane, and trifluoroethanol.

In a ninth aspect (9), the atomic layer deposition method according to any of aspects (1)-(8) is provided and the precursor gas including magnesium is selected from the group of: bis(ethylcyclopentadienyl)magnesium, bis(cyclopentadienyl)magnesium(II), bis(2,2,6,6-tetramethyl-3,5-heptanedionato)magnesium, bis(N,N'-di-sec-butylacetamidinato)magnesium, and bis(pentamethylcyclopentadienyl)magnesium.

In a tenth aspect (10), the atomic layer deposition method according to any of aspects (1)-(9) is provided and the method includes repeating steps (i)-(iv) for a plurality cycles to form a magnesium fluoride film comprising a plurality of magnesium fluoride layers.

In an eleventh aspect (11), the atomic layer deposition method according to aspect (10) is provided and the magnesium fluoride film has a thickness in a range of 25 nanometers to 75 nanometers.

In a twelfth aspect (12), the atomic layer deposition method according to aspect (11) is provided and the magnesium fluoride film has an optical absorption value of 1% or less for light having a wavelength of 266 nanometers and an incident angle of 6 degrees.

In a thirteenth aspect (13), the atomic layer deposition method according to aspect (11) or aspect (12) is provided and the magnesium fluoride film has an optical transmittance value of 94% or more for light having a wavelength of 266 nanometers and an incident angle of 6 degrees.

In a fourteenth aspect (14), the atomic layer deposition method according to ay of aspects (11)-(13) is provided and the magnesium fluoride film has a surface roughness (Ra) of 1.5 nanometers or less.

In a fifteenth aspect (15), the atomic layer deposition method according to ay of aspects (11)-(14) is provided and the magnesium fluoride film has a refractive index of 1.42 or less for light having a wavelength of 266 nanometers.

In a sixteenth aspect (16), the atomic layer deposition method according to ay of aspects (11)-(15) is provided and the magnesium fluoride film has a carbon content of 1.2 atomic % or less at a depth of 0.02 microns measured using secondary ion mass spectrometry.

In a seventeenth aspect (17), the atomic layer deposition method according to ay of aspects (11)-(16) is provided and the surface of the lens includes a surface bounded by a peripheral edge, and the magnesium fluoride film covers the entire surface bounded by the peripheral edge.

In an eighteenth aspect (18), the atomic layer deposition method according to aspect (17) is provided and the magnesium fluoride film has a thickness variation of 10% or less.

In a nineteenth aspect (19), the atomic layer deposition method according to aspect (17) is provided and the magnesium fluoride film comprises a thickness variation of 5% or less.

In a twentieth aspect (20), the atomic layer deposition method according to any of aspects (1)-(19) is provided and the lens is held substantially motionless during the atomic layer deposition method.

In a twenty-first aspect (21), the atomic layer deposition method according to any of aspects (1)-(20) is provided and step (iii) includes a remote plasma process.

A twenty-second aspect (22) of the present application is directed to an optical lens including a surface coated with a magnesium fluoride layer deposited according to the atomic layer deposition method according to any of aspects (1)-(21).

A twenty-third aspect (23) of the present application is directed to an optical lens including a magnesium fluoride film coated over a surface of the optical lens, the magnesium fluoride film having a thickness in a range of 25 nanometers to 75 nanometers; an optical absorption value of 1% or less for light having a wavelength of 220 nanometers and an incident angle of 6 degrees; and a thickness variation of 5% or less.

In a twenty-fourth aspect (24), the optical lens according to aspect (23) is provided and the magnesium fluoride film has an optical transmittance value of 94% or more for light having a wavelength of 220 nanometers and an incident angle of 6 degrees.

In a twenty-fifth aspect (25), the optical lens according to aspect (23) or aspect (24) is provided and the surface of the lens includes a surface bounded by a peripheral edge, and the magnesium fluoride film covers the entire surface bounded by the peripheral edge.

In a twenty-sixth aspect (26), the optical lens according to any of aspects (23)-(25) is provided and the lens further includes an aluminum oxide layer disposed between the magnesium fluoride film and the surface of the optical lens.

A twenty-seventh aspect (27) of the present application is directed to a semiconductor wafer inspection tool including the optical lens according to any of aspects (23)-(26).

A twenty-eighth aspect (28) of the present application is directed to an optical element including an optically transparent lens having a first surface having a steepness value in a range of 0.5 to 1.0 and a second surface opposite the first surface, where the steepness value is equal to the radius of curvature of the first surface divided by the clear aperture of the optically transparent lens; and an optical film disposed over the first surface and the second surface, the optical film including a first index layer having a first index of refraction for light having a wavelength of 550 nanometers, and a second index layer disposed over the first index layer and including a magnesium fluoride film and a low index layer, where the second index layer has a second index of refraction for light having a wavelength of 550 nanometers, and where the second index of refraction is smaller than the first index of refraction.

In a twenty-ninth aspect (29), the optical element according to aspect (28) is provided and the first index layer includes a material selected from the group consisting of: aluminum oxide, hafnium oxide, gadolinium fluoride, and lanthanum fluoride.

In a thirtieth aspect (30), the optical element according to aspect (28) or aspect (29) is provided and the optical film is disposed on the first surface and the second surface.

In a thirty-first aspect (31), the optical element according to any of aspects (28)-(30) is provided and the magnesium fluoride film has a thickness in a range of 25 nanometers to 75 nanometers, an optical absorption value of 1% or less for light having a wavelength of 220 nanometers and an incident angle of 6 degrees, and a thickness variation of 10% or less.

In a thirty-second aspect (32), the optical element according to any of aspects (28)-(31) is provided and the magnesium fluoride film has an optical transmittance value of 94% or more for light having a wavelength of 220 nanometers and an incident angle of 6 degrees.

In a thirty-third aspect (33), the optical element according to any of aspects (28)-(32) is provided and the first index of refraction is 1.6 or more and the second index of refraction is 1.38 or less.

A thirty-fourth aspect (34) of the present application is directed to a semiconductor wafer inspection tool including the optical element according to any of aspects (28)-(33).

BRIEF DESCRIPTION OF THE DRAWINGS

The accompanying figures, which are incorporated herein, form part of the specification and illustrate embodiments of the present disclosure. Together with the description, the figures further serve to explain the principles of and to enable a person skilled in the relevant art(s) to make and use the disclosed embodiments. These figures are intended to be illustrative, not limiting. Although the disclosure is generally described in the context of these embodiments, it should be understood that it is not intended to limit the scope of the disclosure to these particular embodiments. In the drawings, like reference numbers indicate identical or functionally similar elements.

DETAILED DESCRIPTION

Figure 1:
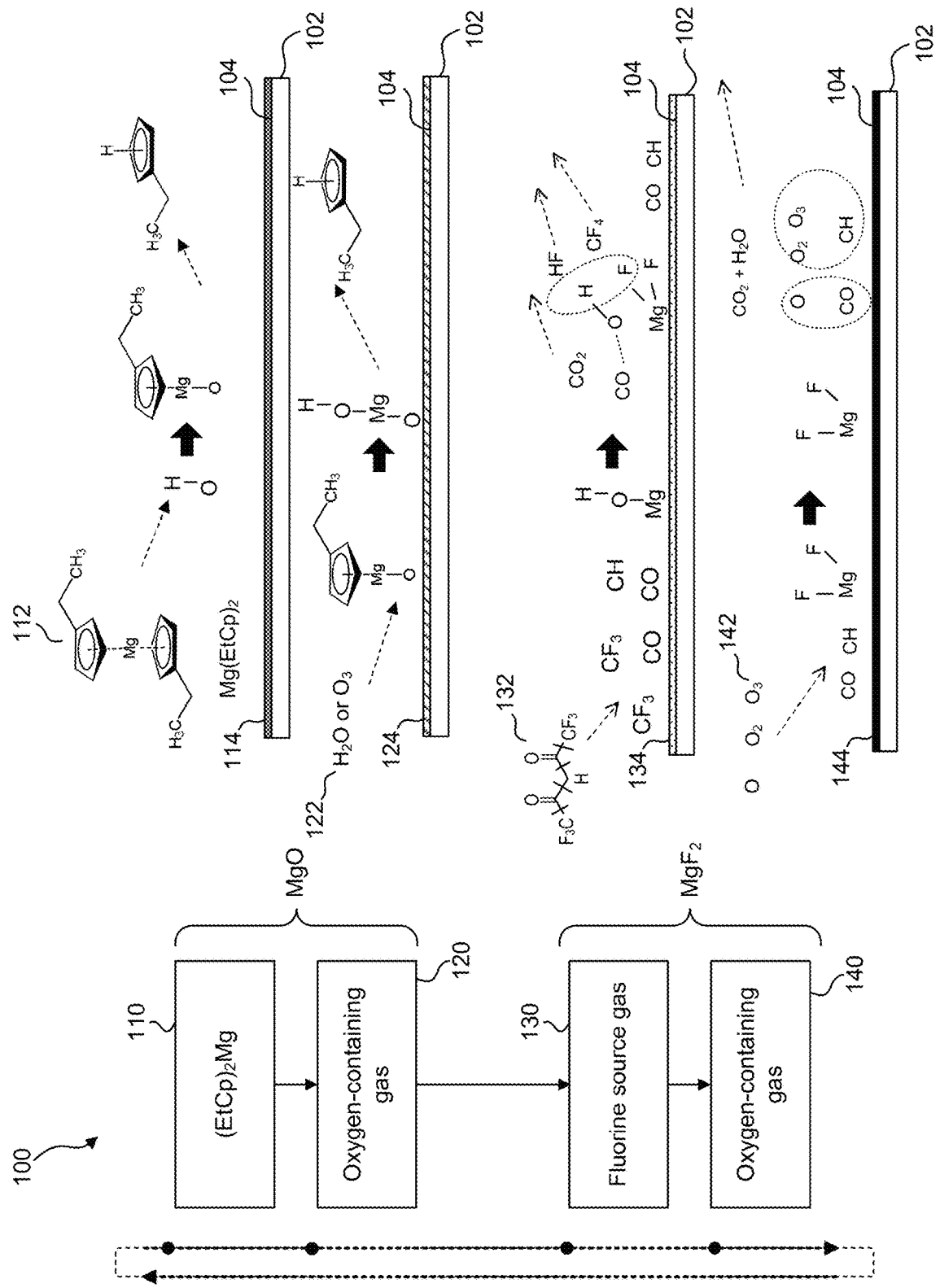
FIG. 1 shows an atomic layer deposition method for depositing a magnesium fluoride film according to some embodiments.

The following examples are illustrative, but not limiting, of the present disclosure. Other suitable modifications and adaptations of the variety of conditions and parameters normally encountered in the field, and which would be apparent to those skilled in the art, are within the spirit and scope of the disclosure.

For optical applications, such as optical lenses, reflection and/or absorption of light can be problematic. Reflection and/or absorption of light reduces the amount of light transmitted through an optical lens towards its desired target. A reduction in light transmitted can impair the resolution of an optical system that relies on an optical lens to collect and focus light. Such a reduction in resolution can impair the ability of the optical system to accurately image an object.

The reflection and/or absorption of light can be dependent on the wavelength(s) of light the optical system utilizes and the surface curvatures of an optical lens utilized to focus the wavelength(s) of light. For example, a high numerical aperture lens (i.e., objective) for an optical inspection system may have a steep surface curvature for focusing light of a particular wavelength, or wavelength range. If light is reflected from such a steep surface, it can impair the ability of the inspection system to accurately image an object. Accurate imaging of an object is important in many applications, such as semiconductor wafer inspection systems. These systems need to be capable of accurately detecting any contamination (e.g., debris particles) on the surfaces of semiconductor wafers for quality control purposes.

Due to the importance of accurately imaging a surface, some optical inspection systems, like semiconductor inspection systems, utilize deep ultra-violet (DUV) laser-based light (i.e., light having a wavelength in the range of 193 nm to 266 nm) or light in the broadband spectrum (i.e., light having a wavelength in the range of 175 nm to 300 nm). These wavelengths are able to achieve higher resolutions than other wavelengths of light (e.g., visible light in the range of 400 nm to 700 nm). However, the intensity of light at these wavelengths is relatively low. Low intensity can be problematic because it can reduce the resolution capabilities of an inspection system Therefore, one or more high numerical aperture lenses with steep surface curvatures may be needed to focus the light. Properly focusing DUV or broadband wavelengths increases the intensity of the light in a detection area, thereby achieving suitable detection resolutions.

For inspection systems utilizing DUV or broadband wavelengths, magnesium fluoride ($MgF_2$) is a suitable anti-reflective coating film material. When deposited properly, magnesium fluoride resists reflection and absorption of light at DUV and broadband wavelengths, even at high incident angles. In other words, when deposited properly, magnesium fluoride is capable of fully transmitting significant amounts of DUV or broadband wavelengths, even at high incident angles.

However, these desirable optical properties are dependent on the elemental composition and uniformity of a magnesium fluoride film. Accordingly, the method utilized to deposit a magnesium fluoride film should be capable of depositing a film having a uniform thickness and the appropriate elemental composition. Atomic layer deposition of magnesium fluoride films has been demonstrated by Hennessy et al. in the article "Atomic Layer Deposition of Magnesium Fluoride Via Bis(ethylcyclopentadienyl)magnesium and anhydrous hydrogen fluoride" (Journal of Vacuum Science and Technology A, 33, 01A125 (2015) (hereinafter referred to as "Hennessey et al."). This article describes a 1-step atomic layer deposition process (referred to herein as "the 1-step ALD process"). This 1-step process utilizes hydrofluoric acid (HF) as a fluorine source. Hydrofluoric acid is a dangerous material to handle and process.

Atomic layer deposition methods according to embodiments discussed herein are capable of depositing magnesium fluoride films having optical properties superior to those deposited with the 1-step ALD process. Methods according to embodiments discussed herein produce magnesium fluoride films with lower optical reflectance, lower optical adsorption, and/or higher optical transmittance compared to films deposited with the 1-step atomic layer deposition process. Furthermore, the methods discussed herein may achieve these properties without the use of hydrofluoric acid.

FIG. 1 illustrates a method 100 for atomic layer deposition of a magnesium fluoride film (e.g., magnesium fluoride film 210) on a surface 104 of a substrate 102 according to some embodiments. Substrate 102 may be, for example, an optical lens (e.g., optical lens 200). Substrate 102 may be a glass substrate, for example soda lime glass, a alkali aluminosilicate glass, an alkali containing borosilicate glass, or an alkali aluminoborosilicate glass substrate. Surface 104 may be, for example, first surface 202 and/or second surface 204 of lens 200. Method 100 is a multi-step atomic layer deposition process that includes the formation of magnesium oxide, and subsequent conversion of the magnesium oxide to magnesium fluoride.

In step 110, substrate 102 is exposed to a precursor gas 112 comprising magnesium, thereby forming a magnesium-containing precursor layer 114 over surface 104 of substrate 102. Precursor gas 112 may include, but is not limited to, bis(ethylcyclopentadienyl)magnesium, bis(cyclopentadienyl)magnesium(II), bis(2,2,6,6-tetramethyl-3,5-heptanedionato)magnesium, bis(N,N'-di-sec-butylacetamidinato) magnesium, bis(pentamethylcyclopentadienyl)magnesium, or a combination of two or more of these gases. Step 110 may be performed at a temperature in the range of 100 degrees C. to 300 degrees C., including subranges. For example, step 110 may be performed at a temperature of 100 degrees C., 150 degrees C., 200 degrees C., 210 degrees C., 220 degrees C., 230 degrees C., 240 degrees C., 250 degrees C., 260 degrees C., 270 degrees C., 280 degrees C., 290 degrees C., 300 degrees C., or at a temperature within a range having any two of these values as endpoints. Unless specified otherwise, a temperature or temperature range at which a step of method 100 is performed is the temperature of substrate 102. For methods utilizing an isothermal reactor, the temperature of the reactor chamber in which substrate 102 is positioned is assumed to be the temperature of substrate 102. The temperature of an isothermal rector chamber may be measured using a thermocouple attached to the chamber wall. For methods utilizing a non-isothermal reactor, the temperature of substrate 102 may be measured using an IR (infrared) temperature probe.

After formation of magnesium-containing precursor layer 114 in step 110, magnesium-containing precursor layer 114 is exposed to an oxygen-containing gas 122 (represented by "$H_2O$ or $O_3$" in FIG. 1) in step 120. This exposure to oxygen-containing gas 122 results in the formation of a magnesium oxide layer 124. The formation of magnesium oxide layer 124 in step 110 reduces carbon impurities in a deposited magnesium fluoride film due to intentional and significant oxide formation before fluoride formation in step 130 (see FIGS. 8A and 8B). Less carbon in the film composition can result in lower amounts of optical absorption and/or higher amounts of optical transmittance in the DUV and/or broadband spectrum compared to the 1-step ALD process.

Oxygen-containing gas 122 may include, but is not limited to, water ($H_2O$), ozone ($O_3$), hydrogen peroxide ($H_2O_2$), menthol ($CH_3OH$), ethanol ($C_2H_5OH$), plasma with oxygen, plasma with oxygen-containing chemicals, or combination of two or more of these gases. In some embodiments, oxygen-containing gas 122 may consist essentially of one or more of these gases. In some embodiments, oxygen-containing gas 122 may consist of one or more of these gases.

Step 120 may be performed at a temperature in the range of 100 degrees C. to 300 degrees C., including subranges. For example, step 120 may be performed at a temperature of 100 degrees C., 150 degrees C., 200 degrees C., 210 degrees C., 220 degrees C., 230 degrees C., 240 degrees C., 250 degrees C., 260 degrees C., 270 degrees C., 280 degrees C., 290 degrees C., 300 degrees C., or at a temperature within a range having any two of these values as endpoints. In some embodiments, step 120 may be performed at about 250 degrees C., for example at a temperature in the range of 240 degrees C. to 260 degrees C.

Figure 4:
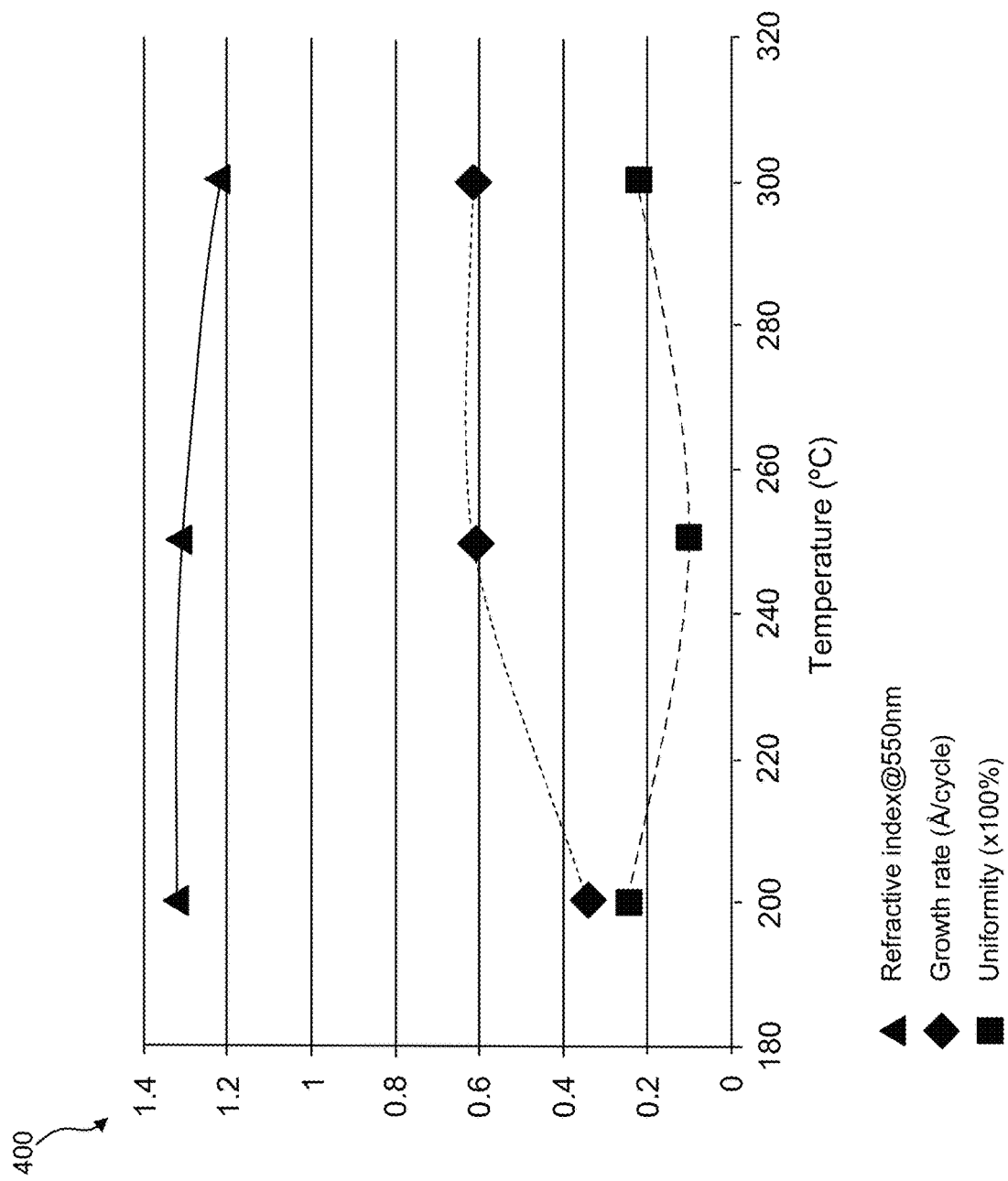
FIG. 4 is a graph of refractive index, growth rate, and uniformity of a magnesium fluoride film as a function of oxygen-containing gas exposure temperature for an atomic layer deposition method according to some embodiments.

The type of oxygen-containing gas 122 and the temperature at which magnesium-containing precursor layer 114 is exposed to oxygen-containing gas 122 may be utilized to control the elemental composition and thickness uniformity of a resulting magnesium fluoride film. A gas 122 that enhances the absorption of precursor layer 114, maximizes ligand removal (e.g., carbon ligand removal) from precursor layer 114, and/or optimizes nucleation of a subsequent layer helps achieve desirable amounts of oxygen and carbon in a magnesium fluoride film. This results in a film with high optical transmittance and low optical absorption. In some embodiments, oxygen-containing gas 122 includes $H_2O$. In some embodiments, oxygen-containing gas 122 includes $H_2O$ and magnesium-containing precursor layer 114 is exposed to the oxygen-containing gas 122 at a temperature in the range of 240 degrees C. to 260 degrees C. The results discussed herein with respect to FIG. 4 illustrate how preforming step 120 at a temperature in the range of 240 degrees C. to 260 degrees C. can achieve desirable properties.

After formation of magnesium oxide layer 124 in step 120, magnesium oxide layer 124 is exposed to a source gas 132 including fluorine (represented by Hhfac in FIG. 1) in step 130. This exposure to source gas 132 results in the formation of an intermediate layer 134 including magnesium and fluoride. Step 130 may be performed at a temperature in the range of 100 degrees C. to 300 degrees C., including subranges. For example, step 130 may be performed at a temperature of 100 degrees C., 150 degrees C., 200 degrees C., 210 degrees C., 220 degrees C., 230 degrees C., 240 degrees C., 250 degrees C., 260 degrees C., 270 degrees C., 280 degrees C., 290 degrees C., 300 degrees C., or at a temperature within a range having any two of these values as endpoints.

In some embodiments, source gas 132 may include one or more organic source gases. Source gas 132 may include, but is not limited to, hexafluoroacetylacetone (Hhfac), carbonyl fluoride, chlorine fluoride, chlorine trifluoride, 1-chloro-2,2-difluoroethene, chlorodifluoromethane, 1-chloro-1-fluoroethane, chloropentafluorobenzene, chloropentafluoroethane, chlorotrifluoroethene, chlorotrifluoromethane, dichlorodifluoromethane, 1,2-dichloro-1,1,2,2-tetrafluoroethane, difluoroethane, difluoromethane, fluoropropane, nitrogen trifluoride, pentafluorobenzene, pentafluoroethane, pentafluorophenol, pentafluorotoluene, perfluorocyclobutane, perfluorocyclohexane, perfluorocyclohexene, perfluoroheptane, perfluoromethylcyclohexane, perfluorotoluene, 1,1,1,2-tetrachloro-2,2-difluoroethane, trichlorofluoromethane, trifluoroacetic acid, trifluoroethane, trifluoroethanol, or a combination of two or more of these gases. In some embodiments, source gas 132 may consist essentially of one or more of these gases. In some embodiments, source gas 132 may consist of one or more of these gases.

In some embodiments, step 130 may include a remote plasma process. In such embodiments, magnesium oxide layer 124 is fluorodized with fluorine generated by flowing one or more fluorine-containing source gases 132 through a plasma source. This will result in the formation of active fluorine radicals in the source gas(es). These radicals are comparatively more reactive than the original source gas(es).

After formation of intermediate layer 134 in step 130, intermediate layer 134 is exposed to an oxygen-containing gas 142 (represented by "O O₂ O₃" in FIG. 1) in step 140. This exposure to oxygen-containing gas 142 results in the formation of a magnesium fluoride layer 144. The type of oxygen-containing gas 142 and the temperature at which intermediate layer 134 is exposed to oxygen-containing gas 142 may be utilized to control the elemental composition and thickness uniformity of a resulting magnesium fluoride film. A gas 142 that efficiently removes residual compounds, such as carbon monoxide (CO) and $CH_x$ molecules (e.g., $CH_3$, $CH_2$, or CH) helps achieve desirable amounts of oxygen and carbon in a magnesium fluoride film, which results in a film with high optical transmittance and low optical absorption.

Oxygen-containing gas 142 may include, but is not limited to, water $H_2O$, ozone ($O_3$), hydrogen peroxide ($H_2O_2$), menthol ($CH_3OH$), ethanol ($C_2H_5OH$), plasma with oxygen, plasma with oxygen-containing chemicals, or combination of two or more of these gases. In some embodiments, oxygen-containing gas 142 may consist essentially of one or more of these gases. In some embodiments, oxygen-containing gas 142 may consist of one or more of these gases. In some embodiments, the oxygen-containing gas 142 utilized in step 140 may be the same as oxygen-containing gas 122 utilized in step 120. In some embodiments, the oxygen-containing gas 142 utilized in step 140 may be different than the oxygen-containing gas 122 utilized in step 120. In some embodiments, oxygen-containing gas may include ozone ($O_3$).

After the formation of magnesium fluoride layer 144 in step 140, step 110 through step 140 may be repeated, sequentially, for a plurality of cycles to form a magnesium fluoride film (e.g., film 210) having a plurality of magnesium fluoride layers 144 deposited via method 100. The thickness of film 210 may be precisely and accurately controlled because atomic layer deposition method 100 is a self-limiting magnesium fluoride layer deposition process. The self-limiting nature of the atomic layer deposition method facilitates consistent and repeatable deposition of film layers having uniform thickness across a surface of substrate, even a substrate with a step surface curvature.

In some embodiments, substrate 102 may be held substantially motionless during method 100. Holding substrate 102 substantially motionless may facilitate uniform deposition of magnesium fluoride layers 144, and thus uniform deposition of a magnesium fluoride film. The pressure within a deposition chamber for steps 110, 120, 130, and 140 may be in the range of 1 torr to 10 torr.

Figure 2:
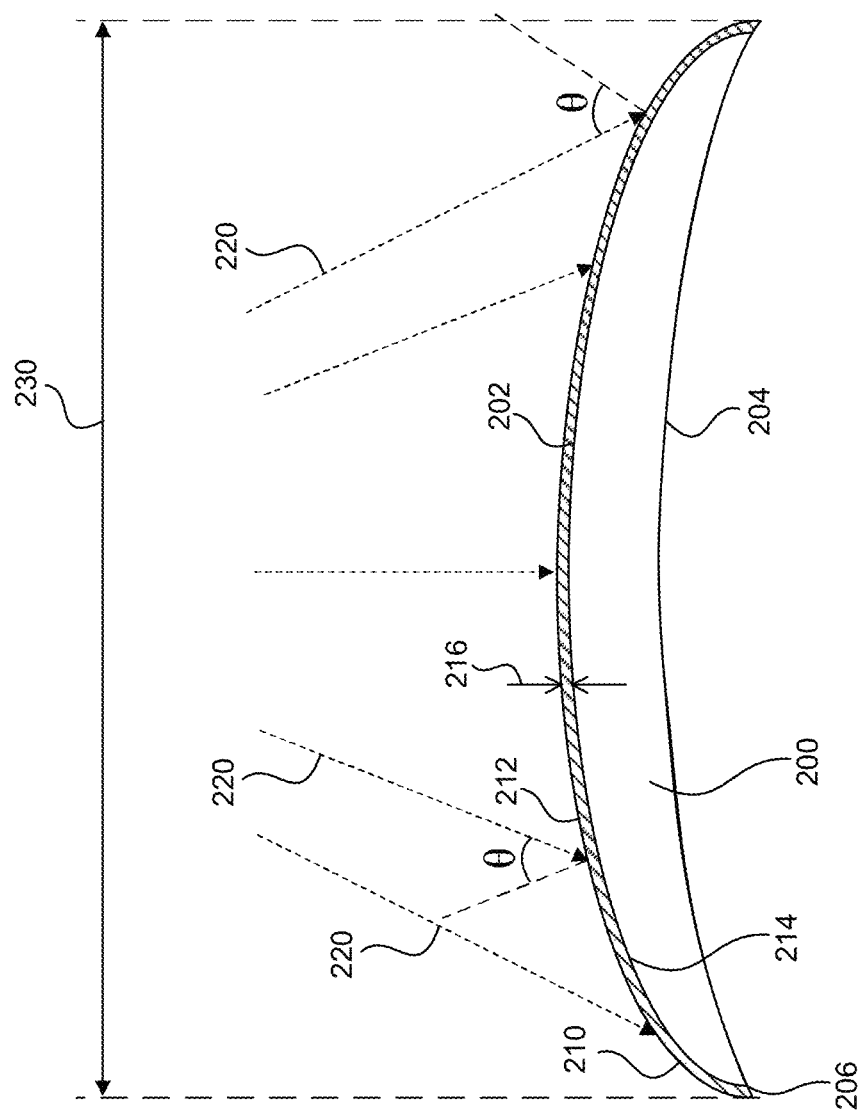
FIG. 2 shows an optical lens according to some embodiments.

FIG. 2 illustrates magnesium fluoride film 210 coated over a first surface 202 of optical lens 200. In some embodiments, magnesium fluoride film 210 may be coated on first surface 202 of optical lens 200. As used herein, "coated on," "disposed on," or "deposited on" means that a first film/layer/component is in direct contact with a second film/layer/component. A first film/layer/component "coated on," "disposed on," or "deposited on" a second film/layer/component may be deposited, formed, placed, or otherwise applied directly onto the second film/layer/component. In other words, if a first film/layer/component is "coated on," "disposed on," or "deposited on" a second film/layer/component, there are no films/layers/components disposed between the first film/layer/component and the second film/layer/component. If a first film/layer/component is described as "disposed over," "coated over," or "deposited over" a second film/layer/component, other films/layers/components may or may not be present between the first film/layer/component and the second film/layer/component.

In some embodiments, a magnesium fluoride film 210 may additionally or alternatively be coated over a second surface 204 of optical lens 200. In some embodiments, a magnesium fluoride film 210 may additionally or alternatively be coated on second surface 204 of optical lens 200. In some embodiments, magnesium fluoride films 210 may be coated on or over both first surface 202 and second surface 204 of lens simultaneously during method 100.

In some embodiments, magnesium fluoride film 210, on first surface 202 and/or second surface 204, may have a thickness 216, measured between a first surface 212 of film 210 and a second surface 214 of film 210, in the range of 25 nanometers to 100 nanometers, including subranges. For example, thickness 216 may be 25 nanometers, 30 nanometers, 35 nanometers, 40 nanometers, 45 nanometers, 50 nanometers, 55 nanometers, 60 nanometers, 65 nanometers, 70 nanometers, 75 nanometers, 80 nanometers, 85 nanometers, 90 nanometers, 95 nanometers, 100 nanometers, or a thickness having a value within a range having any two of these values as endpoints. In some embodiments, thickness 216 may be in the range of 25 nanometers to 75 nanometers. Unless specified otherwise, a thickness 216 value described herein is measured by fitting data from a variable angle spectroscopic ellipsometer (Woollam M2000®, scan from 190 nm to 1600 nm wavelength, incident angle from 45 to about 80 degrees) using CompleteEASE™ software with a Cauchy model.

Method 100 facilitates the deposition of a magnesium fluoride film 210 having one or more of the following seven properties. In some embodiments, magnesium fluoride film 210 may have two or more of the seven properties. In some embodiments, magnesium fluoride film 210 may have three or more of the seven properties. In some embodiments, magnesium fluoride film 210 may have four or more of the seven properties. In some embodiments, magnesium fluoride film 210 may have five or more of the seven properties. In some embodiments, magnesium fluoride film 210 may have six or more of the seven properties. In some embodiments, magnesium fluoride film 210 may have all seven properties.

In some embodiments, magnesium fluoride film 210 may have one or more of the seven properties at a thickness 216 in the range of 25 nanometers to 75 nanometers. In some embodiments, magnesium fluoride film 210 may have two or more of the seven properties at a thickness 216 in the range of 25 nanometers to 75 nanometers. In some embodiments, magnesium fluoride film 210 may have three or more of the seven properties at a thickness 216 in the range of 25 nanometers to 75 nanometers. In some embodiments, magnesium fluoride film 210 may have four or more of the seven properties at a thickness 216 in the range of 25 nanometers to 75 nanometers. In some embodiments, magnesium fluoride film 210 may have five or more of the seven properties at a thickness 216 in the range of 25 nanometers to 75 nanometers. In some embodiments, magnesium fluoride film 210 may have six or more of the seven properties at a thickness 216 in the range of 25 nanometers to 75 nanometers. In some embodiments, magnesium fluoride film 210 may have all seven properties at a thickness 216 in the range of 25 nanometers to 75 nanometers.

(1) An optical absorption value of 1% or less for light (shown in FIG. 2 by lines 220) having a wavelength in the DUV and/or broadband wavelength range and an incident angle (θ) of 6 degrees. In other words, magnesium fluoride film 210 may have an optical absorption value in the range of 0% to 1% for light having a wavelength in the DUV and/or broadband wavelength range and an incident angle (θ) of 6 degrees. For example, magnesium fluoride film 210 may have an optical absorption value of 1% or less for light having a wavelength of 266 nanometers and an incident angle of 6 degrees. In other words, magnesium fluoride film 210 may have an optical absorption value in the range of 0% to 1% for light having a wavelength of 266 nanometers and an incident angle of 6 degrees. In some embodiments, magnesium fluoride film 210 may have an optical absorption value of 1% or less for light having a wavelength of 220 nanometers and an incident angle of 6 degrees. In other words, magnesium fluoride film 210 may have an optical absorption value in the range of 0% to 1% for light having a wavelength of 220 nanometers and an incident angle of 6 degrees.

An "optical absorption value" is the percentage of light that is absorbed by a layer or film of material for a given wavelength of light and a given incident angle (θ) of the light. Absorption of light means that photons of the light neither reflect from nor pass through the layer or film, but are rather taken up by the layer or film and released as energy, usually in the form of heat. A given wavelength of light may be a specific wavelength value or a range of wavelength values. For a range of wavelength values, an optical absorption is calculated by averaging the optical absorption of each whole number wavelength in the range of wavelengths. An incident angle (θ) is the angle at which the light impinges upon a surface of the layer or film of material measured relative to a line perpendicular to the surface at the location of incidence. An optical absorption value may be measured using a spectrometer.

Unless indicated otherwise, an optical absorption value described herein is measured according to the following procedures. The film of material tested was deposited on an 8655 fused silica substrate. The film of material was deposited on opposing sides of the fused silica substrate and the total optical absorption through the film on both sides of the substrate was determined. An Agilent Cary5000 UV-Vis-NIR Spectrophotometer having a wavelength range of 400 nm to 200 nm was used to measure optical transmittance and optical reflection values. The following instrument parameters were used: (i) angle of incidence: 6 degrees, (ii) data interval: 1 nm, 150 nm/min, and (iii) average measurement time: 0.4 seconds. No polarizer was used. Transmittance and reflectance measurements were corrected to the corresponding ratio of the true surface reflectance and transmittance of 8655 fused silica to the measured surface reflectance and transmittance. The standard Fresnel equations for reflected intensity of s- and p-polarizations were used for this correlation. Optical absorption was calculated using the formula:

$$\% A = 100 - \% T - \% R$$

where: % A equals optical absorption, % T equals percent of light transmitted, and % R equals percent of light reflected.

(2) An optical transmittance value of 94% or more for light having a wavelength in the DUV and/or broadband wavelength range and an incident angle (θ) of 6 degrees. In other words, magnesium fluoride film 210 may have an optical transmittance value in the range of 94% to 100% in the DUV and/or broadband wavelength range and an incident angle (θ) of 6 degrees. For example, magnesium fluoride film 210 may have an optical transmittance value of 94% or more for light having a wavelength of 266 nanometers and an incident angle (θ) of 6 degrees. In other words, magnesium fluoride film 210 may have an optical transmittance value in the range of 94% to 100% for light having a wavelength of 266 nanometers and an incident angle (θ) of 6 degrees. In some embodiments magnesium fluoride film 210 may have an optical transmittance value of 94% or more for light having a wavelength of 220 nanometers and an incident angle of 6 degrees. In other words, magnesium fluoride film 210 may have an optical transmittance value in the range of 94% to 100% for light having a wavelength of 220 nanometers and an incident angle of 6 degrees.

An "optical transmittance value" is the percentage of light that passes through a layer or film of material for a given wavelength of light and a given incident angle (θ) of the light. A given wavelength of light may be a specific wavelength value or a range of wavelength values. For a range of wavelength values, an optical transmittance is calculated by averaging the optical transmittance of each whole number wavelength in the range of wavelengths. An optical transmittance value may be measured using a spectrometer.

Unless indicated otherwise, an optical transmittance value described herein is measured according to the following procedures. The film of material tested was deposited on an 8655 fused silica substrate. The film of material was deposited on opposing sides of the fused silica substrate and the total optical transmittance through the film on both sides of the substrate was determined. An Agilent Cary5000 UV-Vis-NIR Spectrophotometer having a wavelength range of 400 nm to 200 nm was used to measure optical transmittance and optical reflection values. The following instrument parameters were used: (i) angle of incidence: 6 degrees, (ii) data interval: 1 nm, 150 nm/min, and (iii) average measurement time: 0.4 seconds. No polarizer was used. Transmittance measurements were corrected to the corresponding ratio of the true surface transmittance of 8655 fused silica to the measured surface transmittance. The standard Fresnel equations for reflected intensity of s- and p-polarizations were used for this correlation.

(3) An optical reflectance value of 5% or less for light having a wavelength in the DUV and/or broadband wavelength range and an incident angle (θ) of 6 degrees. In other words, magnesium fluoride film 210 may have an optical reflectance value in the range of 0% to 5% in the DUV and/or broadband wavelength range and an incident angle (θ) of 6 degrees. For example, magnesium fluoride film 210 may have an optical reflectance value of 5% or less for light having a wavelength of 266 nanometers and an incident angle (θ) of 6 degrees. In other words, magnesium fluoride film 210 may have an optical reflectance value in the range of 0% to 5% for light having a wavelength of 266 nanometers and an incident angle (θ) of 6 degrees. In some embodiments magnesium fluoride film 210 may have an optical reflectance value of 4% or less for light having a wavelength of 220 nanometers and an incident angle of 6 degrees. In other words, magnesium fluoride film 210 may have an optical reflectance value in the range of 0% to 4% for light having a wavelength of 220 nanometers and an incident angle of 6 degrees.

An "optical reflectance value" is the percentage of light that reflects off the surface of a layer or film of material for a given wavelength of light and a given incident angle (θ) of the light. A given wavelength of light may be a specific wavelength value or a range of wavelength values. For a range of wavelength values, an optical reflectance is calculated by averaging the optical reflectance of each whole number wavelength in the range of wavelengths. An optical reflectance value may be measured using a spectrometer.

Unless indicated otherwise, an optical reflectance value described herein is measured according to the following procedures. The film of material tested was deposited on an 8655 fused silica substrate. The film of material was deposited on opposing sides of the fused silica substrate and the total optical reflectance of the film on both sides of the substrate was determined. An Agilent Cary5000 UV-Vis-NIR Spectrophotometer having a wavelength range of 400 nm to 200 nm was used to measure optical transmittance and optical reflection values. The following instrument parameters were used: (i) angle of incidence: 6 degrees, (ii) data interval: 1 nm, 150 nm/min, and (iii) average measurement time: 0.4 seconds. No polarizer was used. Reflectance measurements were corrected to the corresponding ratio of the true surface reflectance of 8655 fused silica to the measured surface reflectance. The standard Fresnel equations for reflected intensity of s- and p-polarizations were used for this correlation.

(4) A surface roughness (Ra) of 1.5 nanometers or less. In some embodiments, magnesium fluoride film 210 may have a surface roughness (Ra) or 1.5 nanometers to 1 nanometer. Ra surface roughness may be measured using atomic force microscopy. Unless stated otherwise, an Ra (arithmetic average roughness) value described herein is a surface roughness of a surface shape obtained by measuring 2 micron by 2 micron square area with an atomic force microscope having a resolution of 512×512 pixels.

(5) A refractive index of 1.42 or less for light having a wavelength of 266 nanometers. In some embodiments, magnesium fluoride film 210 may have a refractive index in the range of 1.42 to 1.38 for light having a wavelength of 266 nanometers. Unless indicated otherwise, a refractive index value described herein is measured by fitting data from a variable angle spectroscopic ellipsometer (Woollam M2000®, scan from 190 nm to 1600 nm wavelength, incident angle from 45 to about 80 degrees) using CompleteEASE™ software with a Cauchy model.

(6) A carbon content of 1.2 atomic % or less at a depth of 0.02 microns measured using secondary ion mass spectrometry. In some embodiments, a magnesium fluoride film 210 may have a carbon content in the range of 0.01 atomic % to 1.2 atomic % at a depth of 0.02 microns measured using secondary ion mass spectrometry. In some embodiments, a magnesium fluoride film 210 may have a carbon content of 1 atomic % or less at a depth of 0.02 microns measured using secondary ion mass spectrometry. In some embodiments, a magnesium fluoride film 210 may have a carbon content in the range of 0.01 atomic % to 1 atomic % at a depth of 0.02 microns measured using secondary ion mass spectrometry.

Unless indicated otherwise, the carbon content of a film is measured using an Cs micro-beam ion gun with the following parameters: (i) energy (volts) 1000, (ii) scan size-X: 400.0 micrometers (μm), (iii) scan size-Y: 400.0 micrometers (μm), (iv) beam current: 20 nanoamperes (nA), (v) primary beam angle: 45 degrees, and (vi) sputter rate: $2.9 \times 10^{-5}$ micrometers/second. Data was normalized based on a standard sample with controlled concentration of carbon.

(7) A thickness variation of 10% or less. In some embodiments, magnesium fluoride film 210 may have a thickness variation in the range of 0% to 10%, including subranges. For example, magnesium fluoride film 210 may have a thickness variation of 0%, 0.1%, 1%, 2%, 3%, 4%, 5%, 10%, or a thickness variation within a range having any two of these values as endpoints. In some embodiments, magnesium fluoride film 210 may have a thickness variation of 5% or less. In some embodiments, magnesium fluoride film 210 may have a thickness variation of 3% or less.

A "thickness variation" for a layer or film of material is caudated using the following equation:

$$T = SD/A \times 100$$

where T equals the thickness variation, SD equals to the standard deviation of a representative set of thickness measurements, and A equals the average value of the representative set thickness measurements. A thickness variation is defined by the thickness variation for the entire surface area of a film or layer disposed over a surface bound by a peripheral edge represented by set of thickness measurements. For example, first surface 202 of lens 200 is bounded by a peripheral edge 206. In some embodiments, magnesium fluoride film 210 may cover the entirety of first surface 202 of lens 200 bounded by peripheral edge 206. In such embodiments, the thickness variation of film 210 is defined by the thickness variation of film 210 disposed over the entirety of first surface 202, not just a portion of film 210. Similarly, for a magnesium fluoride film 210 covering the entirety of second surface 204 of lens 200 bounded by peripheral edge 206, the thickness variation of film 210 is defined by the thickness variation of film 210 disposed over the entirety of second surface 204, not just a portion of film 210.

Thickness values for a film may be measured by a spectroscopic ellipsometer. A representative set of thickness measurements includes at least three measurements. For purposes of selecting points for thickness measurements, the points should be spaced apart to provide a representation of the entire film being measured and should not all be located in a single region of the film (i.e., not all at the edge of the film).

Figure 3:
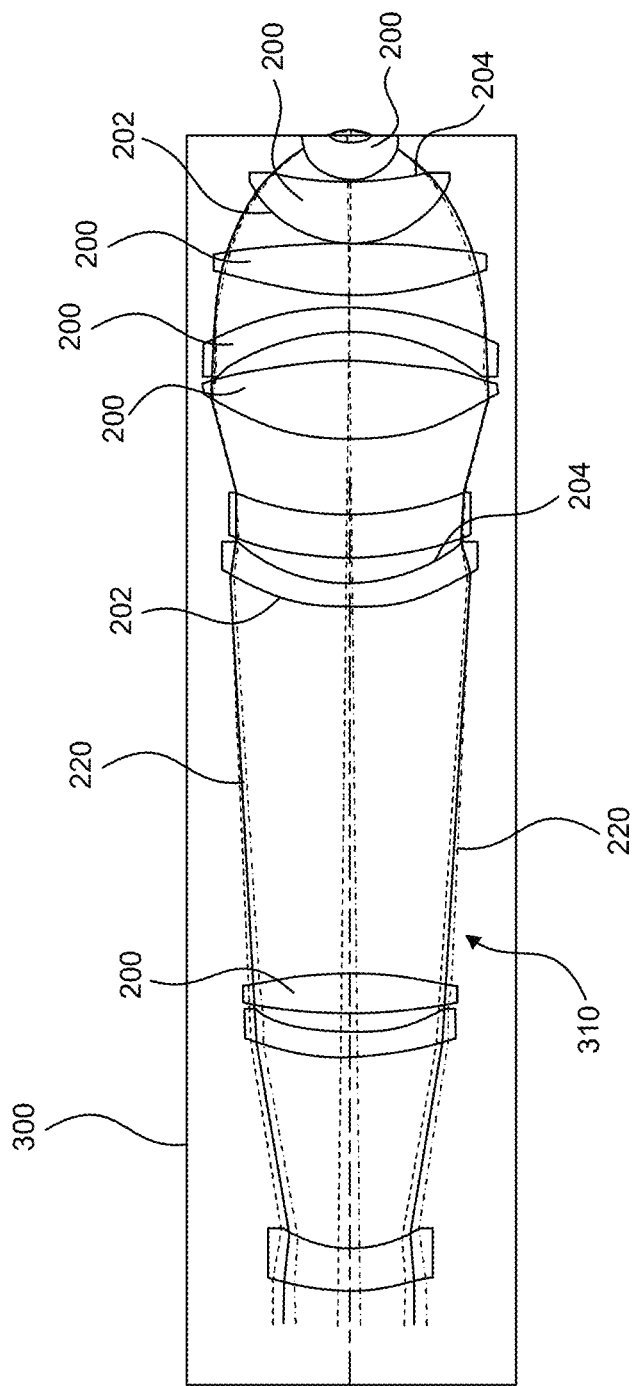
FIG. 3 shows an optical tool according to some embodiments.

Optical lens 200 coated within one or more magnesium fluoride films 210 may be employed in various optical applications. For example, coated optical lens 200 may be employed in optical inspection tools, microscopes, and dark-field polarized scatter-meters. In particular, coated optical lens 200 may be employed in an optical application where collection, transmission, and/or focusing of DUV light and/or light in the broadband spectrum is desired. For example, coated optical lens 200 may be employed in semiconductor inspection tool 300 illustrated in FIG. 3. Semiconductor inspection tool 300 may include an optical element 310 including one or more coated lenses 200 for focusing incident light 220 having a wavelength in the DUV light spectrum or the broadband light spectrum.

Lenses 200, uncoated or coated with film(s) 210, may be optically transparent. As used herein, the term "optically transparent" means a transmittance, or average transmittance, of 90% or more for a particular wavelength, or range of wavelengths, through a 1.0 mm thick piece of a material. In some embodiments, an optically transparent material may have a transmittance, or average transmittance, of 95% or more, or 98% or more for a particular wavelength, or range of wavelengths. The average transmittance for a wavelength range is calculated by measuring the transmittance of all whole number wavelengths within the range and averaging the measurements. In some embodiments, the wavelength may be any whole number wavelength in the range of 193 nm to 266 nm. In some embodiments, the wavelength range may be 193 nm to 266 nm. In some embodiments, the wavelength may be any whole number wavelength in the range of 400 nm to 700 nm. In some embodiments, the wavelength range may be 400 nm to 700 nm.

In some embodiments, one or more of coated lenses 200 may have a first surface 202 with a steepness value in the range of 0.5 to 1.0, where the steepness value is equal to the radius of curvature of first surface 202 divided by the clear aperture of the coated lens 200. A steepness value in this range facilities focusing of DIV and/or broadband spectrum light to an intensity suitable for accurate detection resolutions in an optical inspection system (e.g., an inspection system including semiconductor inspection tool 300).

A "clear aperture" is the diameter of a lens through which light passes during the intended use of the lens. In some cases, the "clear aperture" may be the diameter of the entire lens measured between opposing points on the peripheral edge of the lens. In some cases, the "clear aperture" may be less than the diameter of the entire lens, for example, if the lens is surrounded by a frame that ends over a peripheral edge of the lens. For non-circular lenses, the "clear aperture" is the maximum outer cross-sectional dimension of the lens shape through which light passes during the intended use of the lens. A steepness value for a lens is calculated using the following equation:

$$S=R/\#$$

where S is the steepness value, R is the radius of curvature of the lens surface, and # is the clear aperture of the lens.

In some embodiments, magnesium fluoride film 210 may be disposed over or on first surface 202 of lens in tool 300. As used herein, the "first surface" of a lens may be the surface of the lens at which incident light enters the lens 200 during its intended use. In some embodiments, magnesium fluoride film 210 may be disposed over or on second surface 204 of a lens 200 in tool 300. As used herein, the "second surface" of a lens may be the surface of the lens at which incident light leaves the lens 200 during its intended use. In some embodiments, magnesium fluoride film 210 may be disposed over or on both first surface 202 and second surface 204 of a lens 200 in tool 300. In some embodiments, second surface 204 may be a curved surface with a steepness value in the range of 0.5 to 1.0, where the steepness value is equal to the radius of curvature of second surface 204 divided by the clear aperture 230 of the coated lens 200.

In some embodiments, one or more lenses 200 of optical element 310 may be coated with an optical film (e.g., optical film 902) that includes one or more magnesium fluoride films 210. In such embodiments, the optical film may be disposed over or on first surface 202, over or on second surface 204, or both.

The following tests illustrate the effectiveness of magnesium fluoride films 210 deposited according to embodiments of the present invention. In particular, the following tests illustrate the superior compositional, structural, and optical properties of magnesium fluoride films 210 deposited according to embodiments of the present invention in comparison with the 1-step ALD process.

FIG. 4 shows a graph 400 illustrating how step 120 of method 100 can be utilized to control and optimize refractive index, growth rate, and uniformity of magnesium fluoride films. The results shown in graph 400 are for three magnesium fluoride films 210 having a thickness of 50 nanometers deposited on an optical lens via method 100. Each film 210 was deposited by (i) exposing the optical lens to Bis(ethylcyclopentadienyl)magnesium gas at a temperature of 250 degrees C. to form a magnesium-containing precursor layer, (ii) exposing the magnesium-containing precursor layer to $H_2O$ gas to form a magnesium oxide layer, (iii) exposing the magnesium oxide layer to Hhfac gas at a temperature of 250 degrees C. to form an intermediate layer, (iv) exposing the intermediate layer to ozone gas at a temperature of 250 degrees C. to form magnesium fluoride layer, and repeating steps (i)-(iv) a plurality of times to achieve a film thickness of 50 nanometers. The $H_2O$ gas exposure temperature in step (ii) for the first film was 200 degrees C., the $H_2O$ gas exposure temperature in step (ii) for the second film was 250 degrees C., and the $H_2O$ gas exposure temperature in step (ii) for the third film was 300 degrees C.

As shown in graph 400, the refractive index at 550 nanometers decreases as the $H_2O$ gas exposure temperature in step (ii) is increased from 200 degrees C. to 300 degrees C. The first film, the second film, and the third film had a refractive index at 550 nanometers in the range of 1.4 to 1.2. Without being bound by theory, it is believed higher process temperatures for step (ii) result in more carbon in a magnesium fluoride film due to the thermal decomposition of ligands present in the magnesium-containing precursor layer. The higher carbon content is recognizable by the decrease in refractive index across the first, second, and third films.

For growth rate, graph 400 shows that a $H_2O$ gas exposure temperature of about 250 degrees C. significantly increases the growth rate per cycle (a cycle=one iteration of steps (i)-(iv)). The growth rate peaks at about 0.6 angstroms (Å)/cycle for a temperature of about 250 degrees C. and decreases slightly as the temperature increases towards 300 degrees C. A growth rate of 0.6 angstroms/cycle is about 50% higher than the about 0.4 angstroms/cycle for the 1-step ALD process performed at 200 degrees C.

For uniformity, graph 400 shows that a $H_2O$ gas exposure temperature of about 250 degrees results in the best thickness uniformity (i.e., the lowest value for "thickness variation"). The second film had a thickness uniformity of about 10%, which is less than half of that for the first film and the third film. Both the first and third films have a thickness uniformity of greater than 20%. This is significant because the thickness uniformity of a magnesium fluoride film affects the optical properties of the film. For example, non-uniformity can locally increase optical absorption and/or locally decrease optical transmittance.

Taken as a whole, graph 400 illustrates that the exposure temperature for step 120 in method 100 may be utilized to control and optimize properties of a magnesium fluoride film. The 1-step ALD process does not include step 120 and is therefore incapable of controlling and optimizing the properties of a magnesium fluoride film in this fashion. In particular, graph 400 illustrates that, in some embodiments, an exposure temperature in the range of 240 degrees C. to 260 degrees C. for step 120 may be utilized to optimize properties of a magnesium fluoride film. Also, graph 400 illustrates that, in some embodiments, an exposure temperature for $H_2O$ gas in the range of 240 degrees C. to 260 degrees C. for step 120 may be utilized to optimize properties of a magnesium fluoride film.

To evaluate the effect of different oxygen-containing gases in step 120 of method 100, a magnesium fluoride film was deposited on an optical lens using the same process parameters as those used for the second film in graph 400, except $H_2O$ gas was substituted for ozone gas. The film deposited using $H_2O$ gas in step 120 (i.e., the second film in graph 400) exhibited lower thickness variation and higher refractive index at 550 at nanometers compared to the one deposited using ozone gas in step 120. This higher refractive index indicates a higher oxide density and relatively less carbon in the film. Accordingly, the composition of the oxygen-containing gas in step 120 can also be utilized to control and optimize properties of a magnesium fluoride film. Again, the 1-step ALD process does not include step 120 and is therefore incapable of controlling and optimizing the properties of a magnesium fluoride film in this fashion.

Figure 5B:
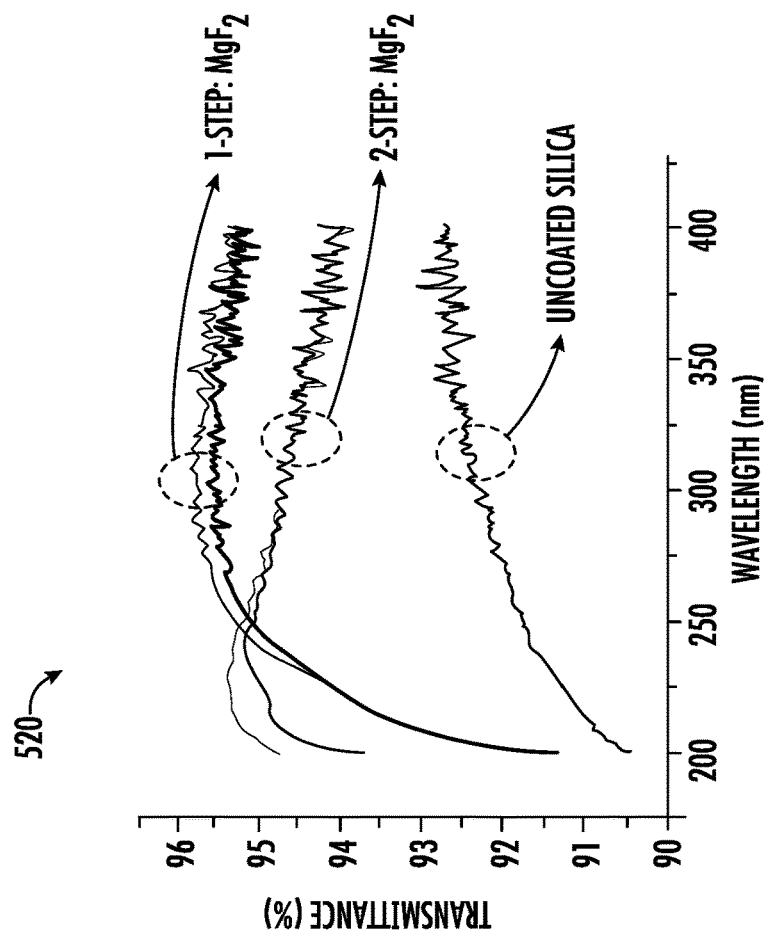
FIG. 5B is a graph of optical transmittance for uncoated silica, magnesium fluoride films deposited via a 1-step atomic layer deposition method, and magnesium fluoride films deposited via a 2-step atomic layer deposition method according to some embodiments.
Figure 5A:
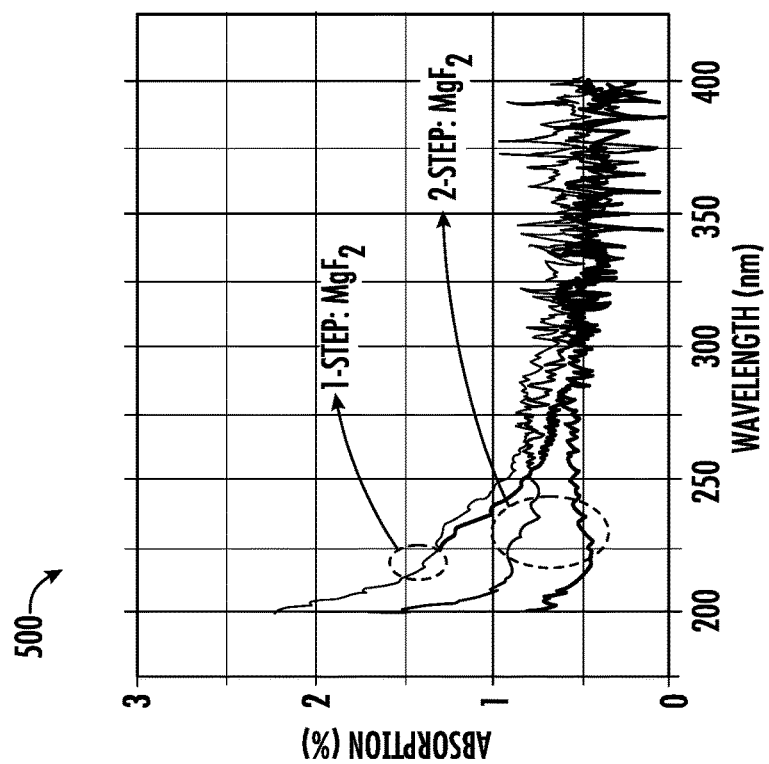
FIG. 5A is a graph of optical absorption for magnesium fluoride films deposited via a 1-step atomic layer deposition method and magnesium fluoride films deposited via a 2-step atomic layer deposition method according to some embodiments.
Figure 5C:
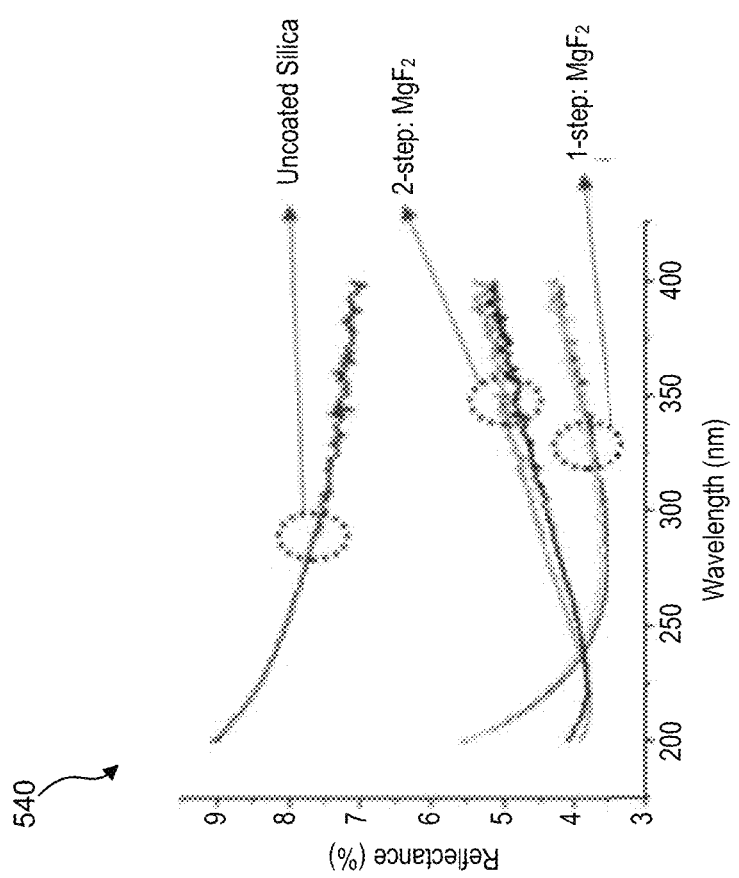
FIG. 5C is a graph of optical reflectance for uncoated silica, magnesium fluoride films deposited via a 1-step atomic layer deposition method, and magnesium fluoride films deposited via a 2-step atomic layer deposition method according to some embodiments.

FIGS. 5A-5C are graphs comparing the optical properties of magnesium fluoride films deposited according to embodiments of the present invention (referred to as "2-step: $MgF_2$") and magnesium fluoride films deposited according to the 1-step ALD process (referred to as "1-step: $MgF_2$") as a function of incident light wavelength. FIGS. 5B and 5C also show the optical properties for uncoated silica for reference. The incident light had an incident angle of 6 degrees.

The 2-step: $MgF_2$ films were deposited using method 100 with a process temperature of 250 degrees C., Bis(ethylcyclopentadienyl)magnesium as the precursor gas 112, $H_2O$ as the oxygen-containing gas 122, Hhfac as the source gas 132, and $O_3$ as the oxygen-containing gas 142. The 1-step: $MgF_2$ films were deposited using the method described in Hennessy et al. with a process temperature of 150 degrees C. and HF as the source gas.

As shown in graph 500 of FIG. 5A, the 2-step: $MgF_2$ films have a recognizably lower optical absorption for wavelengths between 200 nanometers and 300 nanometers. For example, the 2-step: $MgF_2$ films exhibited an optical absorption of less than 1% for wavelengths as low as about 210 nanometers. The 1-step: $MgF_2$ films achieved an optical absorption of less than 1% at a wavelength of about 245 nanometers. Accordingly, graph 500 illustrates the 2-step: $MgF_2$ films have less optical absorption in the DUV and/or broadband light wavelength range compared to the 1-step: $MgF_2$ films. It believed this is the result of less carbon in the 2-step film composition (see FIGS. 8A and 8B).

Relatedly, as shown in graph 520 of FIG. 5B, the 2-step: $MgF_2$ films have a recognizably higher optical transmittance for wavelengths between 200 nanometers and 250 nanometers. For example, the 2-step: $MgF_2$ films exhibited an optical transmittance of greater than 94% for wavelengths as low as about 210 nanometers. The 1-step: $MgF_2$ films achieved an optical transmittance of greater than 94% at a wavelength of about 225 nanometers. Accordingly, graph 520 illustrates the 2-step: $MgF_2$ films can achieve greater optical transmittance at low wavelengths in the DUV and/or broadband light spectrum compared to the 1-step: $MgF_2$ films. It believed this is the result of less carbon in the 2-step film composition (see FIGS. 8A and 8B).

As shown in graph 540 of FIG. 5C, the 2-step: $MgF_2$ films also have a recognizably lower optical reflectance for wavelengths less than 250 nanometers. For example, the 2-step: $MgF_2$ films exhibited an optical reflectance of about 4% for wavelengths in the range of 200 nanometers to 250 nanometers. The 1-step: $MgF_2$ films achieved an optical reflectance of less than 4% at a wavelength of about 240 nanometers. Accordingly, graph 540 illustrates the 2-step: $MgF_2$ films can achieve lower optical reflectance at low wavelengths in the DUV and/or broadband light spectrum compared to the 1-step: $MgF_2$ films. Again, it believed this is the result of less carbon in the 2-step film composition (see FIGS. 8A and 8B).

As evident in graphs 500, 520, and 540, the 2-step: $MgF_2$ films achieved optical properties superior to, or at least comparable to, the 1-step: $MgF_2$ films across the entire DUV light spectrum (i.e., wavelengths in the range of 193 nm to 266 nm). However, the 2-step: $MgF_2$ films were deposited without the use of HF. Since HF is a relatively dangerous material, a deposition method that eliminates the need for HF may be beneficial.

Figure 6:
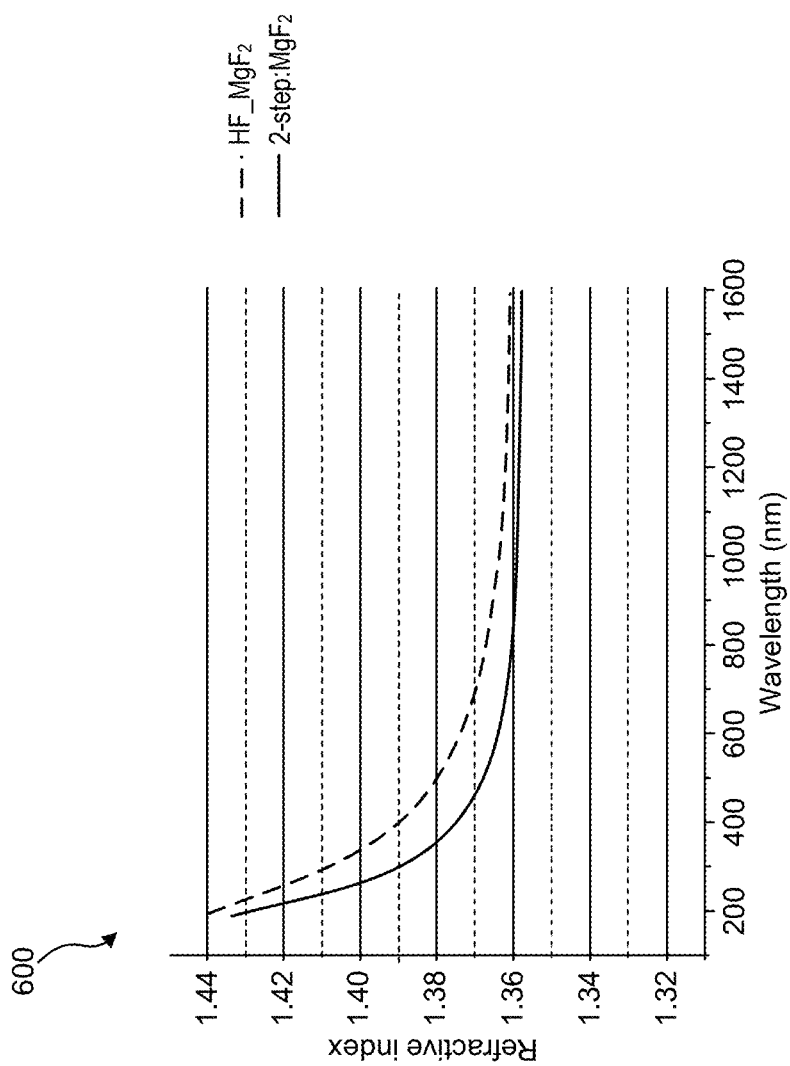
FIG. 6 is a graph of the refractive index as a function of light wavelength for a magnesium fluoride film deposited via a 1-step atomic layer deposition method and magnesium fluoride films deposited via a 2-step atomic layer deposition method according to some embodiments.

Graph 600 of FIG. 6 shows a comparison of the refractive index for a magnesium fluoride film deposited according to embodiments of the present invention (referred to as "2-step: $MgF_2$") and a magnesium fluoride film deposited according to the 1-step ALD process (referred to as "HF_$MgF_2$") as a function of incident light wavelength. As shown in graph 600, the 2-step: $MgF_2$ film had a lower refractive index. This lower refractive index is believed to be caused by the lower amount of carbon in the 2-step: $MgF_2$ film.

Figures 7A, 7B:
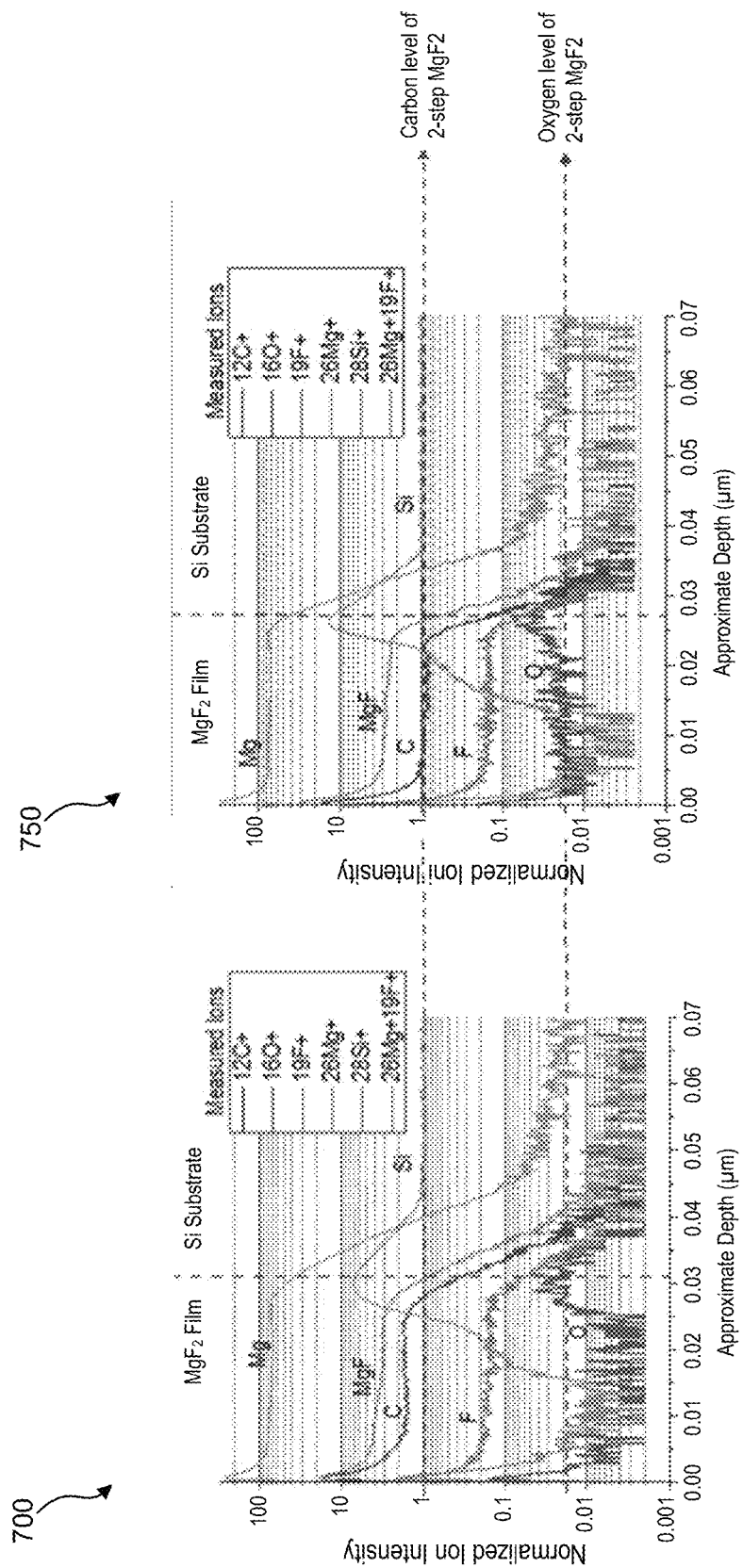
FIG. 7A is a graph of secondary ion mass spectroscopy results for a magnesium fluoride film deposited via a 1-step atomic layer deposition method.
FIG. 7B is a graph of secondary ion mass spectroscopy results for a magnesium fluoride film deposited via a 2-step atomic layer deposition method according to some embodiments.

Secondary ion mass spectroscopy (SIMS) was used to analyze the compositional differences between magnesium fluoride films deposited according to embodiments of the present invention and films deposited using the 1-step ALD process. FIG. 7A shows a graph 700 of the SIMS results for a 1-step: $MgF_2$ film. FIG. 7B shows a graph 750 of the SIMS results for a 2-step: $MgF_2$ film.

The mean normalized carbon ion intensity and mean normalized oxygen ion intensity for the 1-step ALD film in graph 700 are: about 1.66 atomic % and 0.0041 atomic %, respectively. In contrast, the mean normalized carbon intensity and mean normalized oxygen ion intensity for the 2-step $MgF_2$ film in graph 750 are: about 1 atomic % and about 0.019 atomic %, respectively. So, the 2-step $MgF_2$ film contained about 40% less carbon ions and significantly more oxygen ions. For example, at an approximate depth of 0.02 microns, the 2-step $MgF_2$ film had a carbon content of about 1 atomic % and the 1-step ALD film has a carbon content of about 1.66 atomic %. As discussed above, the lower amount of carbon in the 2-step $MgF_2$ film improves optical properties of the film for use optical applications in the DUV and/or broadband light spectrum.

Figure 8:
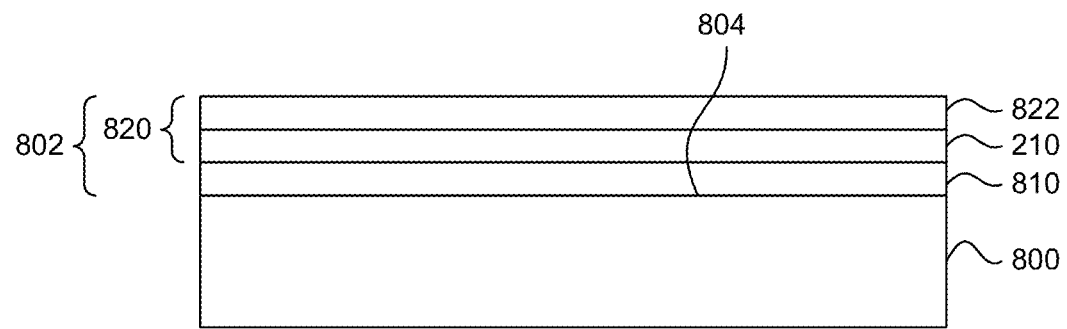
FIG. 8 shows an optical lens coated with an optical film according to some embodiments.

In some embodiments, magnesium fluoride film(s) 210 may be layered with other optical layers to produce optical films having desired properties. FIG. 8 shows an optical film 802 disposed over a surface 804 of an optical lens 800 according to some embodiments. In some embodiments, optical film 802 may be disposed on surface 804. Surface 804 may be a first surface of an optical lens (e.g., first surface 202) or a second surface of an optical lens (e.g., second surface 204). In some embodiments, an optical film 802 may be disposed on or over opposing sides of an optical lens (e.g., first surface 202 and second surface 204).

Optical film 802 includes layer 810 and index layer 820. Index layer 820 is disposed over index layer 810 and includes at least one magnesium fluoride film 210. In some embodiments, optical film 802 may include a plurality of index layers 810 and/or a plurality of index layers 820. In some embodiments, optical film 802 may include a plurality of index layers 810 and/or a plurality of magnesium fluoride films 210. In some embodiments, optical film 802 may include a plurality of index layers 810 and plurality of magnesium fluoride films 210 arranged in an alternating fashion.

In some embodiments, index layer 820 may include at least one low index layer 822. Low index layer 822 may be an outmost layer of optical film 802 in contact with the atmosphere surrounding lens 800 during use.

The indices of refraction of index layer 810 and/or low index layer 822 may help minimize the amount of light reflected from optical lens 800. Optical lenses, typically made of silica, generally have a refractive index of about 1.5 for light having a wavelength of 550 nanometers. In general, to provide desirable anti-reflective properties, an anti-reflective coating is designed to have a refractive index of about 1.2 for light with a wavelength of 550 nanometers. However, magnesium fluoride films according to embodiments of the present application may have a refractive index in the range of 1.42 to 1.38 or light with a wavelength of 550 nanometers.

The use of index layer 810 with a relatively high refractive index increases the equivalent refractive index of lens 800. This facilitates the use of magnesium fluoride films with relatively high refractive indices above about 1.2. Low index layer 822 reduces the refractive index mismatch between the atmosphere and magnesium fluoride films with relatively high refractive indices above about 1.2. This helps prevent reflection of light as the light enters optical film 802.

Index layer 810 has a first index of refraction for light having a wavelength of 550 nanometers and index layer 820 has a second index of refraction for light having a wavelength of 550 nanometers that is smaller than the first index of refraction. In some embodiments, the first index of refraction may be 1.6 or more. For example, in some embodiments the first index of refraction may be in the range of 1.6 to 2.0. In some embodiments, the second index of refraction may be 1.38 or less. For example, in some embodiments, the second index of refraction may be in the range of 1.2 to 1.38. For an index layer 820 including a magnesium fluoride film 210 and a low index layer 822, the refractive index of index layer 820 is the average of the refractive index of the magnesium fluoride film 210 and the refractive index of the low index layer 822.

Index layer 810 may include a material selected from the group of aluminum oxide, hafnium oxide, gadolinium fluoride, lanthanum fluoride, or a combination thereof. In some embodiments, index layer 810 may be disposed on surface 804. In some embodiments, index layer 810 may consist essentially of one or more of these materials. In some embodiments, index layer 810 may consist of one or more of these materials. In some embodiments, index layer 810 may have a thickness is the range of 250 nanometers to 100 nanometers, including subranges. For example, index layer 810 may have a thickness of 25 nanometers, 30 nanometers, 35 nanometers, 40 nanometers, 45 nanometers, 50 nanometers, 55 nanometers, 60 nanometers, 65 nanometers, 70 nanometers, 75 nanometers, 80 nanometers, 85 nanometers, 90 nanometers, 95 nanometers, 100 nanometers, or a thickness having a value within a range having any two of these values as endpoints.

Low index layer 822 may include a material selected from the group of magnesium fluoride, aluminum fluoride, calcium fluoride, or lithium fluoride, or a combination thereof. In some embodiments, low index layer 822 may consist essentially of one or more of these materials. In some embodiments, low index layer 822 may consist of one or more of these materials. In some embodiments, low index layer 822 may have a thickness in the range of 25 nanometers to 100 nanometers, including subranges. For example, low index layer 822 may have a thickness of 25 nanometers, 30 nanometers, 35 nanometers, 40 nanometers, 45 nanometers, 50 nanometers, 55 nanometers, 60 nanometers, 65 nanometers, 70 nanometers, 75 nanometers, 80 nanometers, 85 nanometers, 90 nanometers, 95 nanometers, 100 nanometers, or a thickness having a value within a range having any two of these values as endpoints.

Figure 9A:
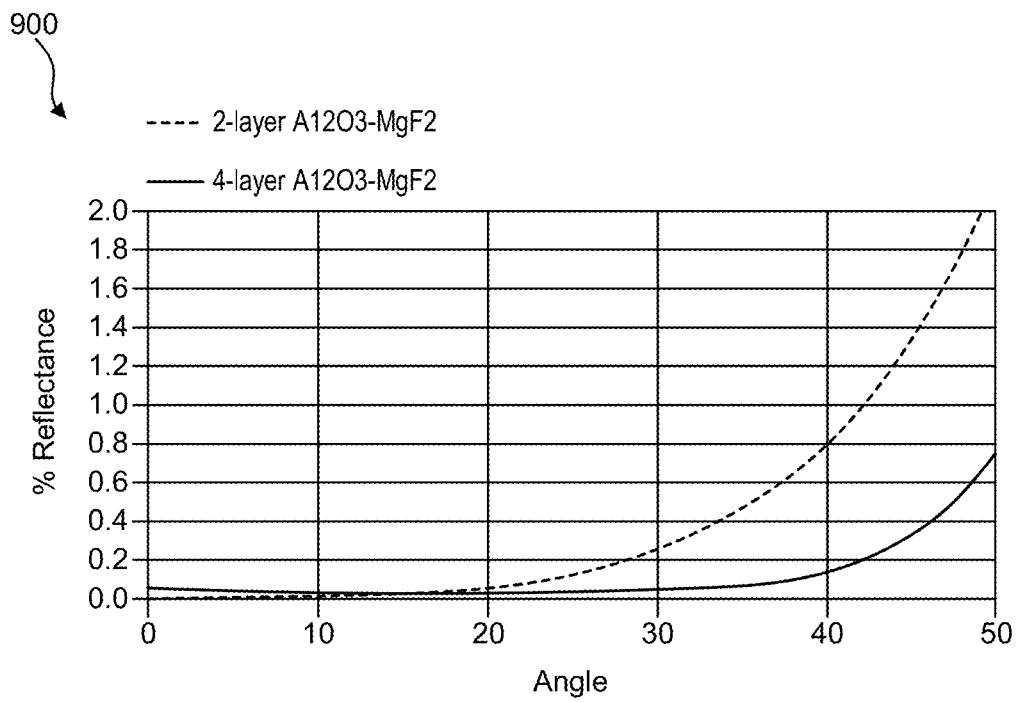
FIG. 9A is a graph of optical reflectance as a function of incident light angle for exemplary index layers according to some embodiments.
Figure 9B:
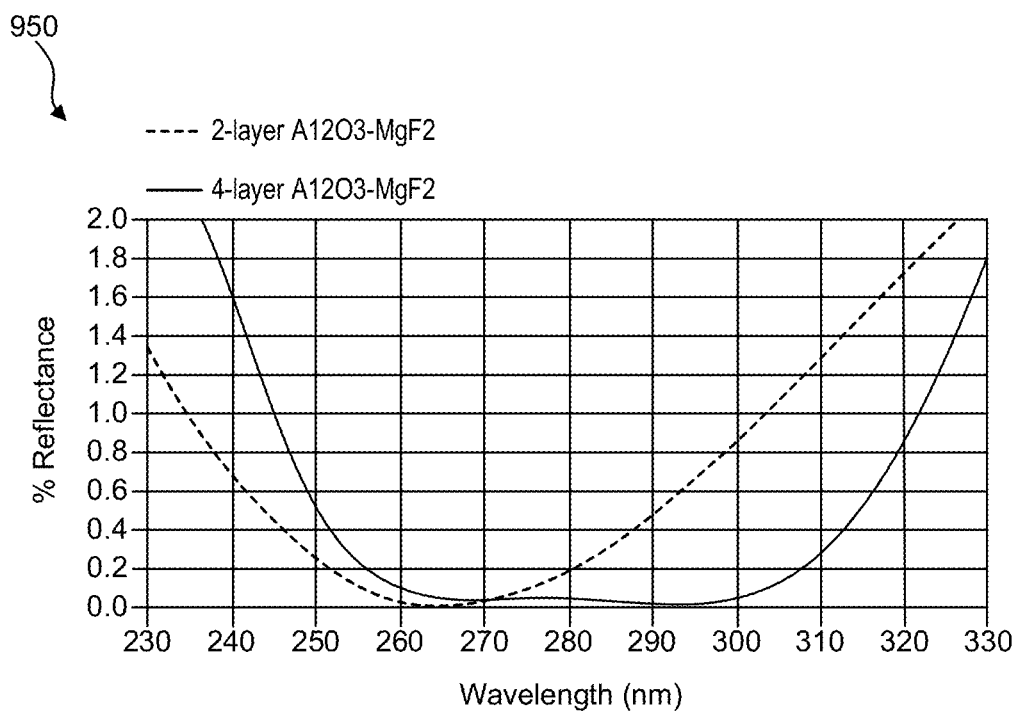
FIG. 9B is a graph of optical reflectance as a function of incident light wavelength for exemplary index layers according to some embodiments.

Desirable optical properties can be achieved by layering one or more magnesium fluoride films 210 and one or more index layers 810. Graph 900 in FIG. 9A shows modeled optical reflectance for (i) a 2-layer optical film 802 including an index layer 810 and a magnesium fluoride film 210 according to some embodiments and (ii) a 4-layer optical film 802 including two magnesium fluoride films 210 and two index layers 810 according to some embodiments as a function of the incident angle for light having a wavelength of 226 nanometers. Graph 950 in FIG. 9B shows modeled optical reflectance of the same two exemplary optical films as a function of wavelength for light having a normal angle of incidence (i.e., angle of incidence equal to zero).

Both the 2-layer optical film 802 and the 4-layer optical film 802 were modeled as coated on an optical lens. The 2-layer optical film 802 included: (i) a 49 nanometer thick aluminum oxide layer coated on the lens and (ii) a 42 nanometer thick magnesium fluoride film coated on the aluminum oxide layer. The 4-layer optical film 802 included: a 70 nanometer thick aluminum oxide layer coated on the lens, (ii) an 82 nanometer thick magnesium fluoride film coated on the 70 nanometer thick aluminum oxide layer, (iii) a 34 nanometer thick aluminum oxide layer coated on the 82 nanometer thick magnesium fluoride film, and (iv) a 50 nanometer thick magnesium fluoride film coated on the 34 nanometer thick aluminum oxide layer.

As shown in graph 900, both the 2-layer and the 4-layer optical films 802 had an optical reflectance of less than 0.2% for incident angles of 25 degrees or less. At incident angles higher than 25 degrees, the 4-layer optical film 802 had less optical reflectance. But both optical films 802 had an optical reflectance of 2% or less for incident angles of 50 degrees or less. As shown in graph 950, the 2-layer optical film 802 generally had less optical reflectance at smaller wavelengths and the 4-layer optical film 802 generally had less optical reflectance at higher wavelengths. But both optical films 802 had an optical reflectance of 2% or less for wavelengths between 230 nanometers and 330 nanometers.

While various embodiments have been described herein, they have been presented by way of example, and not limitation. It should be apparent that adaptations and modifications are intended to be within the meaning and range of equivalents of the disclosed embodiments, based on the teaching and guidance presented herein. It therefore will be apparent to one skilled in the art that various changes in form and detail can be made to the embodiments disclosed herein without departing from the spirit and scope of the present disclosure. The elements of the embodiments presented herein are not necessarily mutually exclusive, but may be interchanged to meet various situations as would be appreciated by one of skill in the art.

Embodiments of the present disclosure are described in detail herein with reference to embodiments thereof as illustrated in the accompanying drawings, in which like reference numerals are used to indicate identical or functionally similar elements. References to "one embodiment," "an embodiment," "some embodiments," "in certain embodiments," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The examples are illustrative, but not limiting, of the present disclosure. Other suitable modifications and adaptations of the variety of conditions and parameters normally encountered in the field, and which would be apparent to those skilled in the art, are within the spirit and scope of the disclosure.

The term "or," as used herein, is inclusive; more specifically, the phrase "A or B" means "A, B, or both A and B." Exclusive "or" is designated herein by terms such as "either A or B" and "one of A or B," for example.

The indefinite articles "a" and "an" to describe an element or component means that one or at least one of these elements or components is present. Although these articles are conventionally employed to signify that the modified noun is a singular noun, as used herein the articles "a" and "an" also include the plural, unless otherwise stated in specific instances. Similarly, the definite article "the," as used herein, also signifies that the modified noun may be singular or plural, again unless otherwise stated in specific instances.

As used in the claims, "comprising" is an open-ended transitional phrase. A list of elements following the transitional phrase "comprising" is a non-exclusive list, such that elements in addition to those specifically recited in the list may also be present. As used in the claims, "consisting essentially of" or "composed essentially of" limits the composition of a material to the specified materials and those that do not materially affect the basic and novel characteristic(s) of the material. As used in the claims, "consisting of" or "composed entirely of" limits the composition of a material to the specified materials and excludes any material not specified.

The term "wherein" is used as an open-ended transitional phrase, to introduce a recitation of a series of characteristics of the structure.

Where a range of numerical values is recited herein, comprising upper and lower values, unless otherwise stated in specific circumstances, the range is intended to include the endpoints thereof, and all integers and fractions within the range. It is not intended that the scope of the claims be limited to the specific values recited when defining a range. Further, when an amount, concentration, or other value or parameter is given as a range, one or more preferred ranges or a list of upper preferable values and lower preferable values, this is to be understood as specifically disclosing all ranges formed from any pair of any upper range limit or preferred value and any lower range limit or preferred value, regardless of whether such pairs are separately disclosed. Finally, when the term "about" is used in describing a value or an end-point of a range, the disclosure should be understood to include the specific value or end-point referred to. Whether or not a numerical value or end-point of a range recites "about," the numerical value or end-point of a range is intended to include two embodiments: one modified by "about," and one not modified by "about."

As used herein, the term "about" means that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art.

The terms "substantial," "substantially," and variations thereof as used herein are intended to note that a described feature is equal or approximately equal to a value or description. For example, a "substantially planar" surface is intended to denote a surface that is planar or approximately planar. Moreover, "substantially" is intended to denote that two values are equal or approximately equal. In some embodiments, "substantially" may denote values within about 10% of each other, such as within about 5% of each other, or within about 2% of each other.

The present embodiment(s) have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

It is to be understood that the phraseology or terminology used herein is for the purpose of description and not of limitation. The breadth and scope of the present disclosure should not be limited by any of the above-described exemplary embodiments, but should be defined in accordance with the following claims and their equivalents.

What is claimed is:

1. An atomic layer deposition method for coating an optical lens with a magnesium fluoride layer, the method comprising:
   (i) exposing an optical lens to a precursor gas comprising magnesium, thereby forming a magnesium-containing precursor layer over a surface of the lens;
   (ii) exposing the magnesium-containing precursor layer to a first oxygen-containing gas, thereby forming a magnesium oxide layer;
   (iii) exposing the magnesium oxide layer to a source gas comprising fluorine, thereby forming an intermediate layer comprising magnesium and fluoride; and
   (iv) exposing the intermediate layer to a second oxygen-containing gas, thereby forming a magnesium fluoride layer.

2. The method of claim 1, wherein exposing the magnesium-containing precursor layer to the first oxygen-containing gas is performed at a temperature in a range of 100 degrees C. to 300 degrees C.

3. The method of claim 1, wherein exposing the magnesium-containing precursor layer to the first oxygen-containing gas is performed at a temperature in a range of 240 degrees C. to 260 degrees C.

4. The method of claim 1, wherein the first oxygen-containing gas comprises a gas selected from the group consisting of: water, ozone, hydrogen peroxide, menthol, ethanol, plasma with oxygen, and plasma with oxygen-containing chemicals.

5. The method of claim 1, wherein the first oxygen-containing gas comprises $H_2O$.

6. The method of claim 1, wherein the first oxygen-containing gas comprises $H_2O$ and wherein the magnesium-containing precursor layer is exposed to $H_2O$ at a temperature in a range of 240 degrees C. to 260 degrees C.

7. The method of claim 1, wherein the source gas comprising fluorine is an organic source gas.

8. The method of claim 1, further comprising repeating steps (i)-(iv) for a plurality of cycles to form a magnesium fluoride film comprising a plurality of magnesium fluoride layers.

9. The method of claim 8, wherein the magnesium fluoride film comprises a thickness in a range of 25 nanometers to 75 nanometers.

10. The method of claim 9, wherein the magnesium fluoride film comprises an optical absorption value of 1% or less for light having a wavelength of 266 nanometers and an incident angle of 6 degrees.

11. The method of claim 9, wherein the magnesium fluoride film comprises an optical transmittance value of 94% or more for light having a wavelength of 266 nanometers and an incident angle of 6 degrees.

12. The method of claim 9, wherein the magnesium fluoride film comprises a carbon content of 1.2 atomic % or less at a depth of 0.02 microns measured using secondary ion mass spectrometry.

13. The method of claim 9, wherein the surface of the lens comprises a surface bounded by a peripheral edge, and wherein the magnesium fluoride film covers the entire surface bounded by the peripheral edge.

14. The method of claim 13, wherein the magnesium fluoride film comprises a thickness variation of 10% or less.

15. The method of claim 1, wherein the lens is held substantially motionless during the atomic layer deposition method.

16. An optical lens comprising a surface coated with a magnesium fluoride layer deposited according to the method of claim 1.

17. An optical lens, comprising:
  a magnesium fluoride film coated over a surface of the optical lens, the magnesium fluoride film comprising:
    a thickness in a range of 25 nanometers to 75 nanometers;
    an optical absorption value of 1% or less for light having a wavelength of 220 nanometers and an incident angle of 6 degrees; and
    a thickness variation of 5% or less.

18. The optical lens of claim 17, wherein the magnesium fluoride film comprises an optical transmittance value of 94% or more for light having a wavelength of 220 nanometers and an incident angle of 6 degrees.

19. A semiconductor wafer inspection tool comprising the optical lens of claim 17.

\* \* \* \* \*